United States Patent [19]
Taniguchi et al.

[11] Patent Number: 5,684,675
[45] Date of Patent: Nov. 4, 1997

[54] SEMICONDUCTOR DEVICE UNIT HAVING HOLDER

[75] Inventors: Norio Taniguchi; Junichi Kasai; Kazuto Tsuji; Michio Sono; Masanori Yoshimoto, all of Kawasaki, Japan

[73] Assignee: Fujitsu, Ltd., Kawasaki, Japan

[21] Appl. No.: 252,522

[22] Filed: Jun. 1, 1994

Related U.S. Application Data

[63] Continuation of Ser. No. 152,883, Nov. 16, 1993, abandoned, which is a continuation of Ser. No. 889,955, May 29, 1992, abandoned.

[30] Foreign Application Priority Data

May 31, 1991 [JP] Japan ..................... 3-129776

[51] Int. Cl.⁶ ..................... H05K 7/20
[52] U.S. Cl. ............ 361/704; 174/52.1; 206/711; 269/903; 257/724; 361/731; 361/773; 361/810
[58] Field of Search ............... 174/16, 3, 260, 174/52.1, 52.4; 211/41; 269/903; 206/328, 329, 701, 707, 710, 711, 718; 165/80.3, 185; 439/72, 76, 540; 257/705–707, 712, 713, 723, 724, 730, 73; 361/600, 679, 689, 690, 704, 707, 709, 711, 717, 719–731, 735, 760, 767, 773, 796, 807, 809, 810; 248/27.1, 310

[56] References Cited

U.S. PATENT DOCUMENTS

| | | | |
|---|---|---|---|
| 3,579,046 | 5/1971 | Jordan | 174/52.1 |
| 3,790,859 | 2/1974 | Schraeder | 361/384 |
| 4,220,384 | 9/1980 | Clark et al. | 206/329 |
| 4,227,238 | 10/1980 | Saito | 361/417 |
| 4,420,795 | 12/1983 | Scholz | 361/810 |
| 4,498,123 | 2/1985 | Fuss | 361/427 |
| 4,553,190 | 11/1985 | Mueller | 361/212 |
| 4,663,695 | 5/1987 | Ohkawara | 361/405 |
| 4,667,270 | 5/1987 | Yagi | 361/380 |
| 4,720,771 | 1/1988 | Horton | 361/388 |
| 4,727,456 | 2/1988 | Mehta | 361/420 |
| 4,814,944 | 3/1989 | Sagawa | 361/403 |
| 4,868,712 | 9/1989 | Woodman | 361/388 |
| 4,894,706 | 1/1990 | Sato et al. | 357/72 |
| 4,962,442 | 10/1990 | Clemens | 361/403 |
| 4,965,699 | 10/1990 | Jordh | 361/387 |
| 5,050,039 | 9/1991 | Edfors | 361/388 |
| 5,057,969 | 10/1991 | Ameen | 361/386 |

FOREIGN PATENT DOCUMENTS 0354708  2/1990  European Pat. Off. .

*Primary Examiner*—Gerald P. Tolin
*Attorney, Agent, or Firm*—Staas & Halsey

[57] ABSTRACT

A semiconductor device unit includes a holder having a plurality of holding parts, and a plurality of semiconductor devices held by the holding parts of the holder. Each of the semiconductor devices has a generally parallelepiped shape with top and bottom surfaces and at least one side surface provided with leads which are exposed whereby the semiconductor device unit stands by itself on the leads.

23 Claims, 15 Drawing Sheets

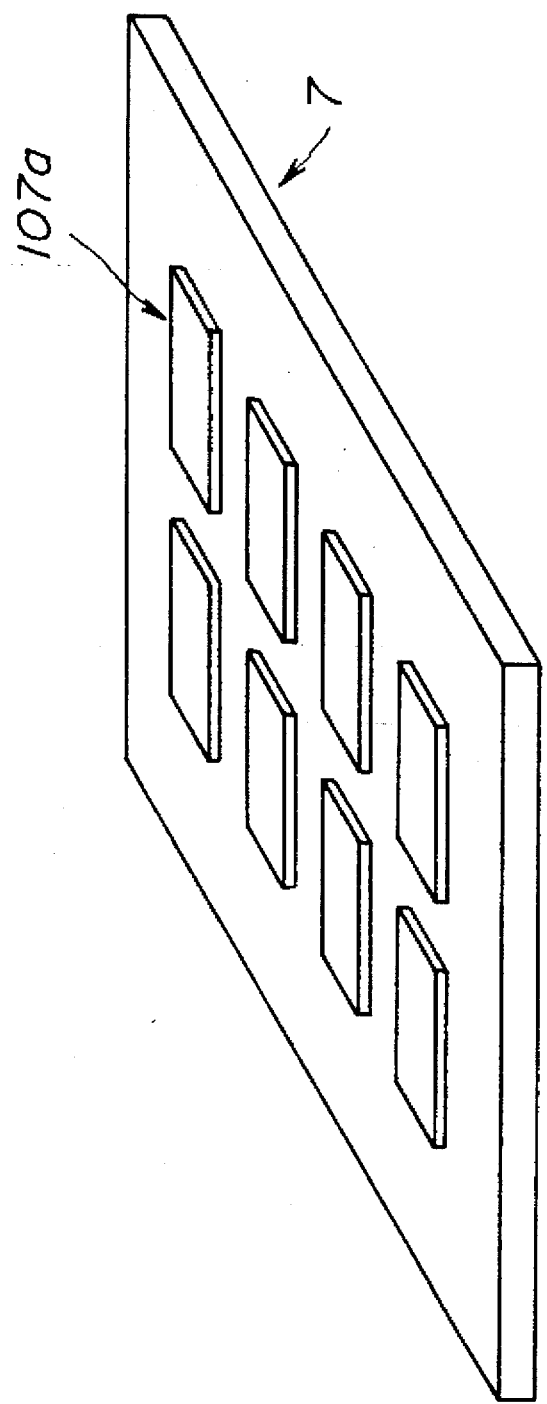

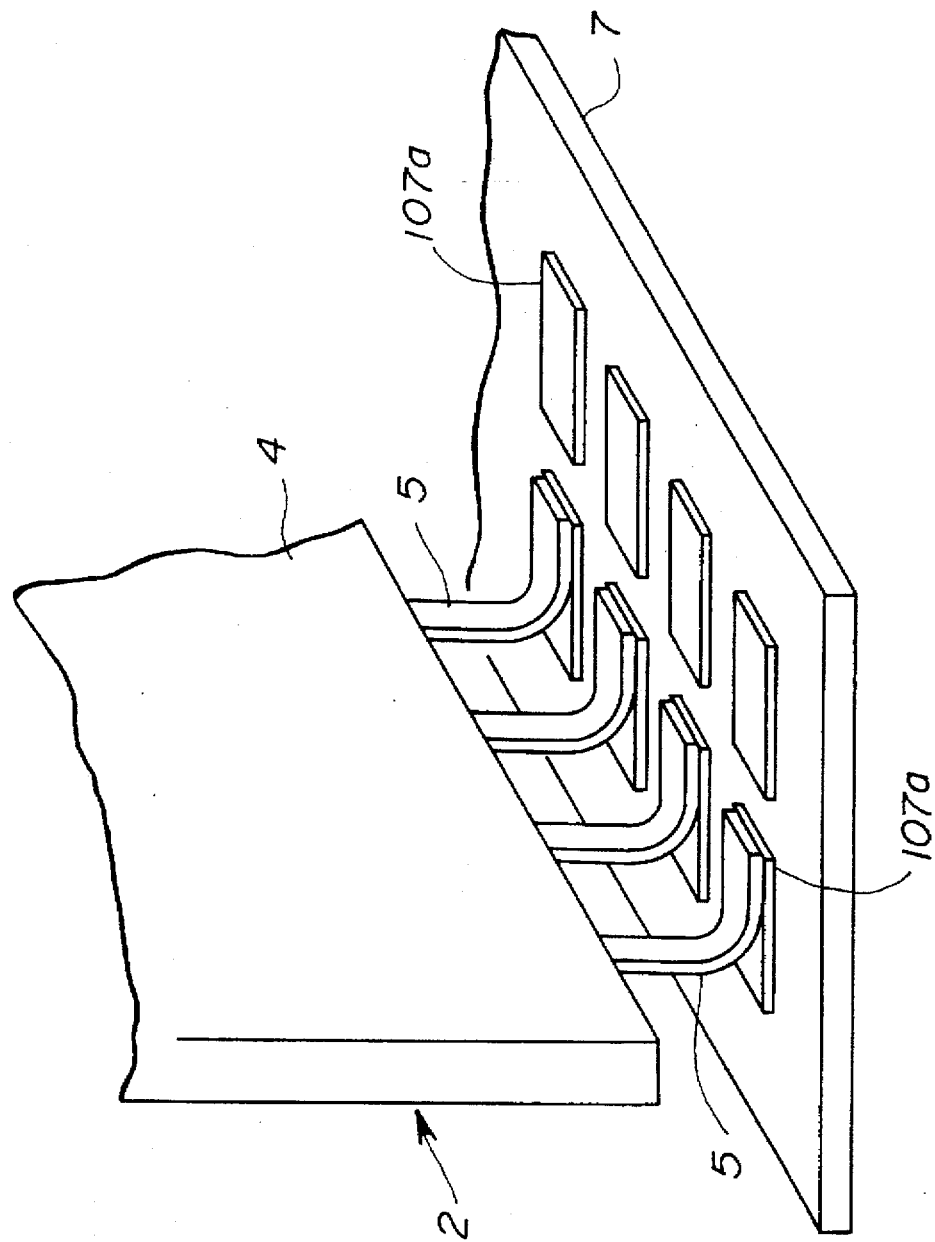

SEMICONDUCTOR DEVICE UNIT HAVING HOLDER

This application is a continuation of application Ser. No. 08/152,883, filed Nov. 16, 1993, and now abandoned which is a continuation of application Ser. No. 07/889,955, filed May 29, 1992, now abandoned.

BACKGROUND OF THE INVENTION

The present invention generally relates to semiconductor device units and methods of mounting semiconductor devices, and more particularly to a semiconductor device unit having a holder, and to a method of mounting semiconductor devices using the holder.

Recently, as the size of computer systems has further been reduced, there are demands to package semiconductor devices with a high density.

On the other hand, in memory devices such as dynamic random access memories (DRAMs), a plurality of semiconductor devices having the same construction are packaged on a single circuit substrate. Accordingly, there are demands to realize a method of packaging a plurality of semiconductor devices having the same construction with a high efficiency.

In order to increase the packaging density, the package structure becomes an important factor. Conventionally, small and thin packages such as the small outline package (SOP), the single in-line package (SIP) and the zigzag in-line package (ZIP) are known as package structures which enable high density packaging.

The SOP is a kind of surface package (surface mount). In other words, SOP type semiconductor device is arranged on solder bumps which are formed on a circuit substrate, and the solder is thereafter melted to fix the semiconductor device.

On the other hand, a vertical type package such as the SIP and the ZIP has a structure such that leads are arranged in line along one side surface of the package. Accordingly, this vertical type package is mounted vertically on the circuit substrate. The packaging density is improved by this vertical mounting, and in addition, it is possible to improve the cooling efficiency of the package.

However, in the case of the SOP, there are problems in that a crack is easily formed in the package because it has a thin flat shape and the heat resistance of the package becomes large. In addition, because the package is surface mounted, there is also a problem in that the packaging area is large compared to that of the SIP, for example.

In the case of the SIP and ZIP, there are problems in that it is difficult to make the package stand because the leads extend outwardly from one side surface thereof and the packaging (or mounting) process is troublesome to perform.

For this reason, a structure has been proposed to help the vertical package stand on the circuit substrate. According to this proposed structure, projections are formed on the package, and holes corresponding to the projections are provided in the circuit substrate. The vertical package stands on the circuit substrate in a state where the projections fit into the corresponding holes of the circuit substrate. However, according to this proposed structure, there are problems in that the holes must be formed in the circuit substrate and the production efficiency becomes poor due to this additional step of forming the holes.

On the other hand, when the vertical package such as the SIP and the ZIP are made thin, there are problems in that a crack is easily formed in the package and the heat resistance of the package becomes large.

SUMMARY OF THE INVENTION

Accordingly, it is a general object of the present invention to provide a novel and useful semiconductor device unit and method of mounting semiconductor devices, in which the problems described above are eliminated.

Another and more specific object of the present invention is to provide a semiconductor device unit comprising a holder having a plurality of holding parts, and a plurality of semiconductor devices held by the holding parts of the holder, where each of the semiconductor devices have a generally parallelepiped shape with top and bottom surfaces and at least one side surface provided with leads which are exposed when the semiconductor device is held by the holding part of the holder. According to the semiconductor device unit of the present invention, it is possible to make the semiconductor devices stand vertically on a circuit substrate because the semiconductor devices are held by the holder. The pitch with which the semiconductor devices may be arranged on the circuit substrate is improved, particularly when two or more semiconductor devices are held by one holding part of the holder. Therefore, the present invention can realize a high density packaging. In addition, the holder protects the relatively thin semiconductor devices the mechanical strength of which is not very large. Furthermore, the heat generated from the semiconductor device is transferred to the holder by thermal conduction and the heat resistance of the semiconductor device unit as a whole is improved compared to that of the semiconductor device itself.

Still another object of the present invention is to provide a method of mounting a plurality of semiconductor devices having leads provided on at least one side surface thereof onto a circuit substrate, comprising the steps of (a) holding the semiconductor devices in holding parts of a holder so that the leads are exposed, and (b) mounting the semiconductor devices held by the holder onto the circuit substrate by connecting the exposed leads to the circuit substrate. According to the method of the present invention, it is possible to make the semiconductor devices stand vertically on a circuit substrate because the semiconductor devices are held by the holder. The pitch with which the semiconductor devices may be arranged on the circuit substrate is improved, particularly when two or more semiconductor devices are held by one holding part of the holder. Therefore, the present invention can realize a high density packaging. In addition, the holder protects the relatively thin semiconductor devices the mechanical strength of which is not very large. Furthermore, the heat generated from the semiconductor device is transferred to the holder by thermal conduction and the heat resistance of the semiconductor device unit as a whole is improved compared to that of the semiconductor device itself.

Other objects and further features of the present invention will be apparent from the following detailed description when read in conjunction with the accompanying drawings.

BRIEF DESCRIPTION OF THE DRAWINGS

FIGS. 4A through 4D are perspective views for explaining the soldering of leads of the semiconductor devices on a circuit substrate shown in FIG. 1;

DESCRIPTION OF THE PREFERRED EMBODIMENTS

Figure 1:
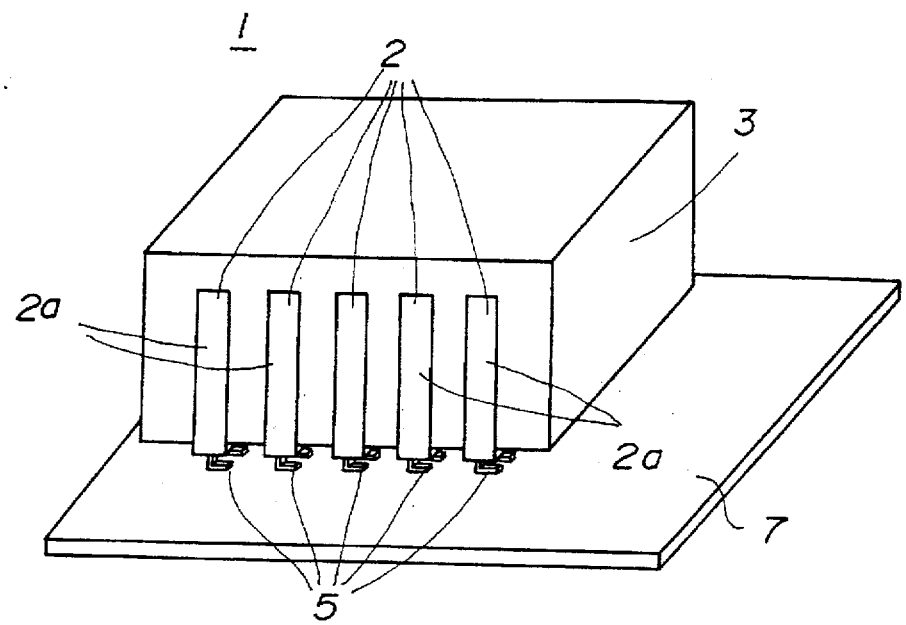
FIG. 1 is a perspective view showing a first embodiment of a semiconductor device unit according to the present invention.

A description will be given of a first embodiment of a semiconductor device unit according to the present invention. FIG. 1 shows the first embodiment, and in FIG. 1, a semiconductor device unit 1 includes semiconductor devices 2 and a holder 3 which holds the semiconductor devices 2.

For example, the semiconductor device 2 may be a memory device such as a DRAM, and a plurality of semiconductor devices having the same construction are packaged on a single circuit substrate 7. Each semiconductor device 2 has the vertical package structure shown on an enlarged scale in FIG. 2. In the semiconductor device 2 shown in FIG. 2, a plurality of leads 5 extend outwardly from one side surface of a package 4 which is made of a resin. A semiconductor element (not shown) such as a memory device is encapsulated within the package 4. Because the package 4 is relatively thin, the mechanical strength of the semiconductor device 2 itself is poor and its heat resistance is large. On the other hand, as shown in FIG. 2, the leads 5 are bent in an L-shape at the tip extension thereof.

Figure 2:
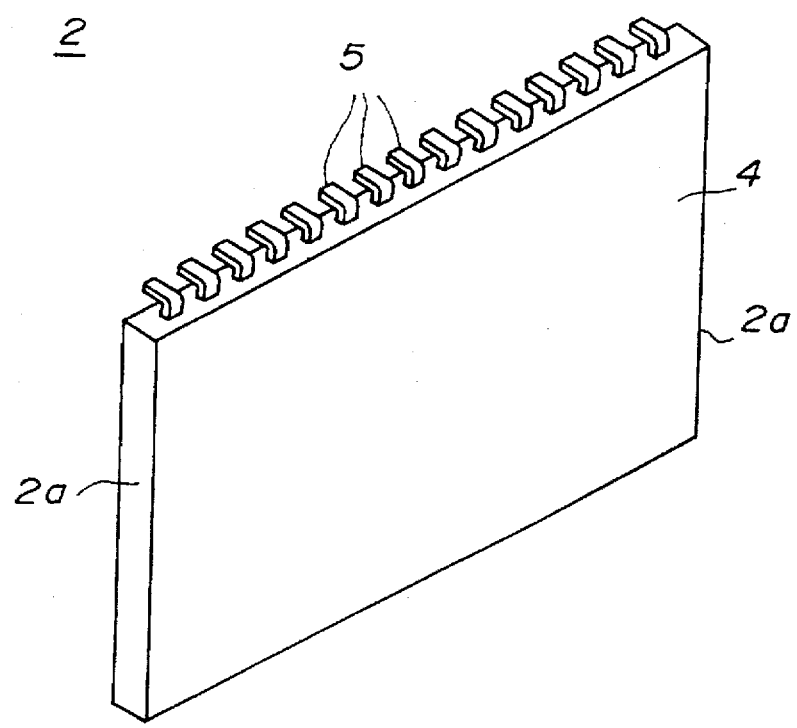
FIG. 2 is a perspective view showing a semiconductor device shown in FIG. 1.

The semiconductor device 2 having the vertical package structure shown in FIG. 2 does not easily stand by itself on the circuit substrate 7. Even if it were possible to make the semiconductor device 2 stand by itself on the circuit substrate 7, the semiconductor device 2 would be too unstable to allow satisfactory soldering of the leads 5 onto the circuit substrate 7.

According to the present invention, the semiconductor devices 2 which by themselves cannot stably stand on the circuit substrate 7 are held by the holder 3 so that the semiconductor devices 2 stand stably on the circuit substrate 7 when soldering the leads 5 onto the circuit substrate 7.

Figure 3:
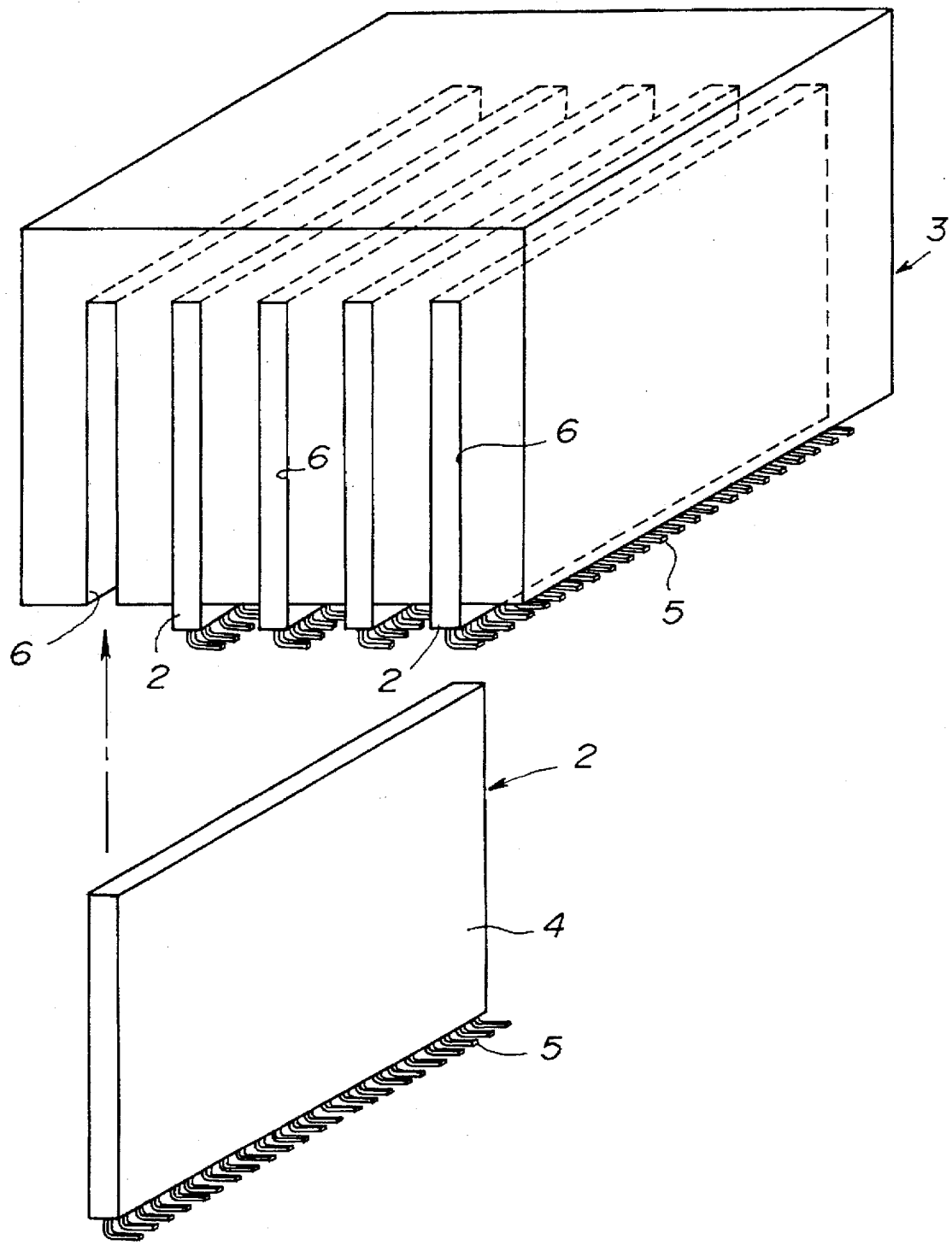
FIG. 3 is a perspective view for explaining holding of the semiconductor devices in a holder shown in FIG. 1.

For example, the holder 3 is molded from a resin and has a box shape as shown in FIG. 3. In this embodiment, the holder 3 has five holding parts 6 for receiving the semiconductor devices 2. Each holding part 6 opens at the front and bottom surfaces of the holder 3. The holding parts 6 may be formed at the same time as molding the holder 3 by known means.

When assembling the semiconductor device unit 1, each semiconductor device 2 is inserted into the corresponding holding part 6 of the holder 3. The semiconductor device unit 1 is assembled by this simple operation. Hence, the packaging process will not become complex and will not greatly increase the number of production steps by this process of assembling the semiconductor device unit 1.

Next, a description will be given of the method of soldering the leads 5 of the semiconductor devices 2 onto the circuit substrate 7, by referring to FIGS. 4A through 4D.

Figure 4A:
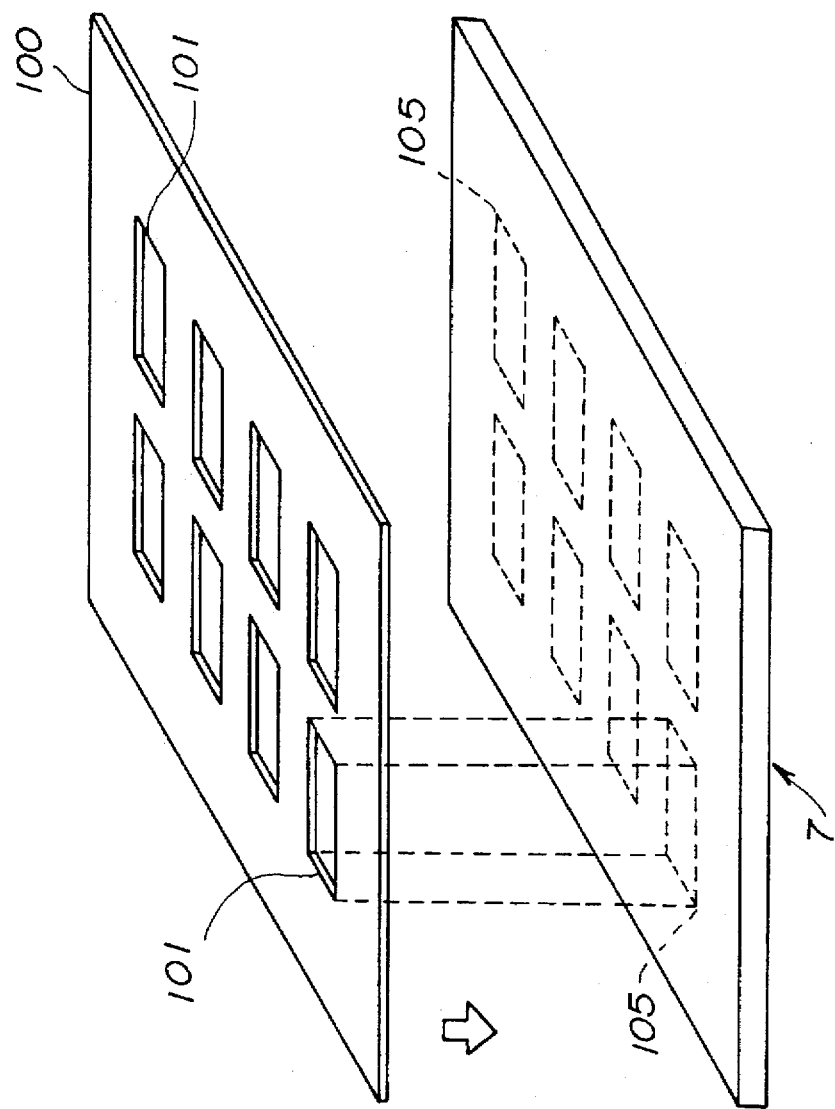

First, in FIG. 4A, a mask 100 including a plurality of windows 101 is placed on the circuit substrate 7 so that each window 101 matches a corresponding region 105 where the solder is to be applied.

Figure 4B:
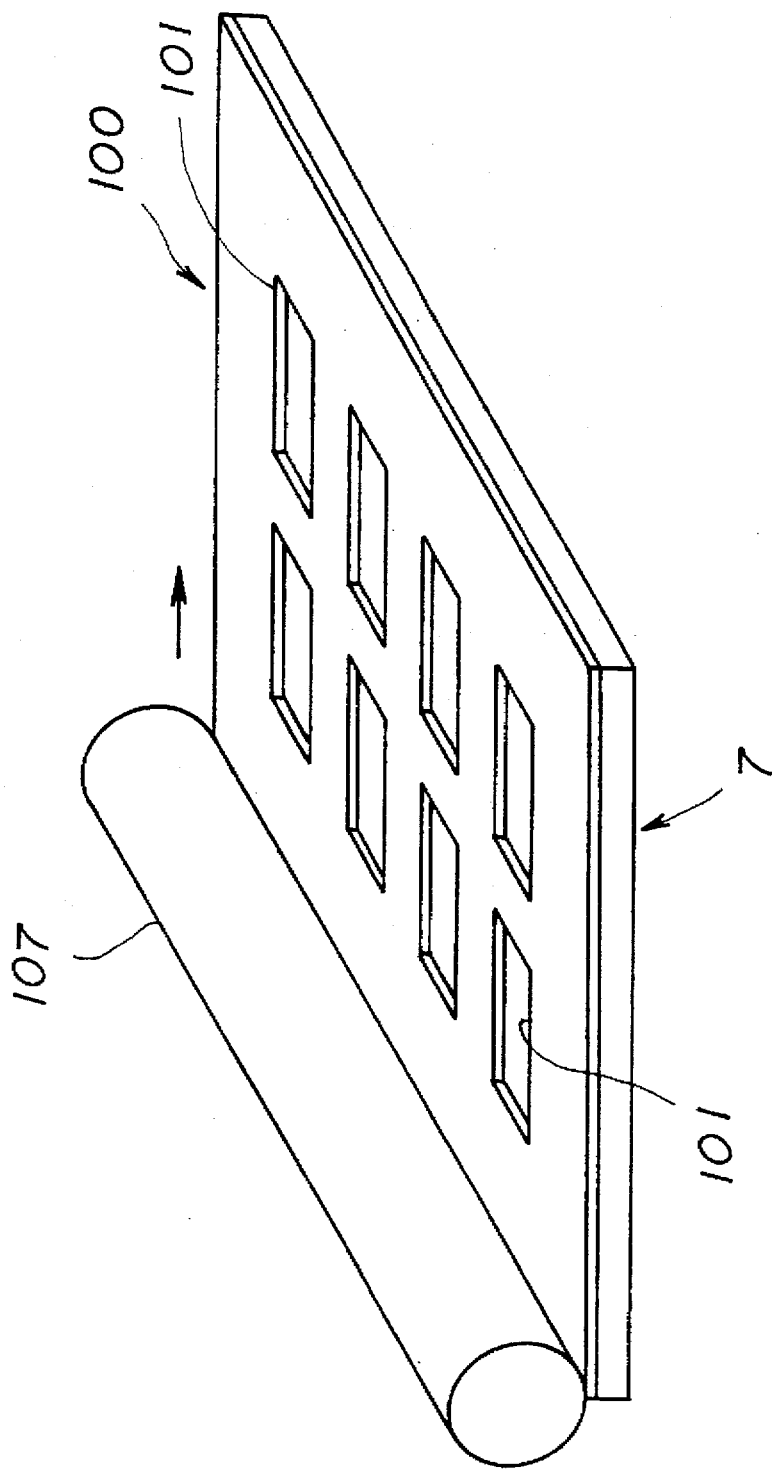

Second, in FIG. 4B, a roll of solder 107 rolls in a direction of an arrow over the mask 100 to form the solder 107 on the regions 105 of the circuit substrate 7 via the windows 101.

Third, in FIG. 4C, the mask 100 is removed, and as a result, solder parts 107a are formed in the regions 105 of the circuit substrate 7.

Fourth, in FIG. 4D, each semiconductor device 2 (only one shown for the sake of convenience) is placed on the circuit substrate 7 so that the leads 5 rest on the corresponding solder parts 107a. Then, a reflow process is carried out to connect the leads 5 onto the circuit substrate 7 by the melted solder parts 107a.

FIG. 1 shows the semiconductor device unit 1 in the assembled state, and the semiconductor devices 2 are held within the holder 3. The leads extend downwardly from each of the semiconductor devices 2 within the holder 3. Accordingly, although each semiconductor device 2 by itself cannot stand stably on the circuit substrate 7, the semiconductor devices 2 within the holder 2 cooperate and stand stably on the circuit substrate 7. There is no need to provide holes in the circuit substrate 7 as in the case of the proposed structure described above, and it is possible to improve the packaging efficiency. In addition, because the semiconductor devices 2 are held by the holder 3, it is possible to reduce the pitch with which the semiconductor devices 2 are arranged on the circuit substrate 7 and realize a high packaging density.

The package 4 is relatively thin and the semiconductor device 2 by itself does not have a satisfactory mechanical strength and has a large heat resistance. However, when the semiconductor devices 2 are held by the holder 3, the package 4 of each semiconductor device 2 is in contiguous contact with walls of the holder 3 defining the corresponding holding part 6. For this reason, the holder 3 also functions as a support member for improving the mechanical strength of each semiconductor device 2, and cracks will not easily be formed in the package 4 although the package 4 itself is relatively thin. Furthermore, the heat generated from each semiconductor device 2 is transferred to the holder 3 by thermal conduction. As a result, the heat resistance of the semiconductor device unit 1 as a whole decreases compared to that of the semiconductor device 2 itself, and the heat is efficiently radiated. Therefore, it is possible to reduce the undesirable effects of heat on each of the semiconductor devices 2.

Figure 5:
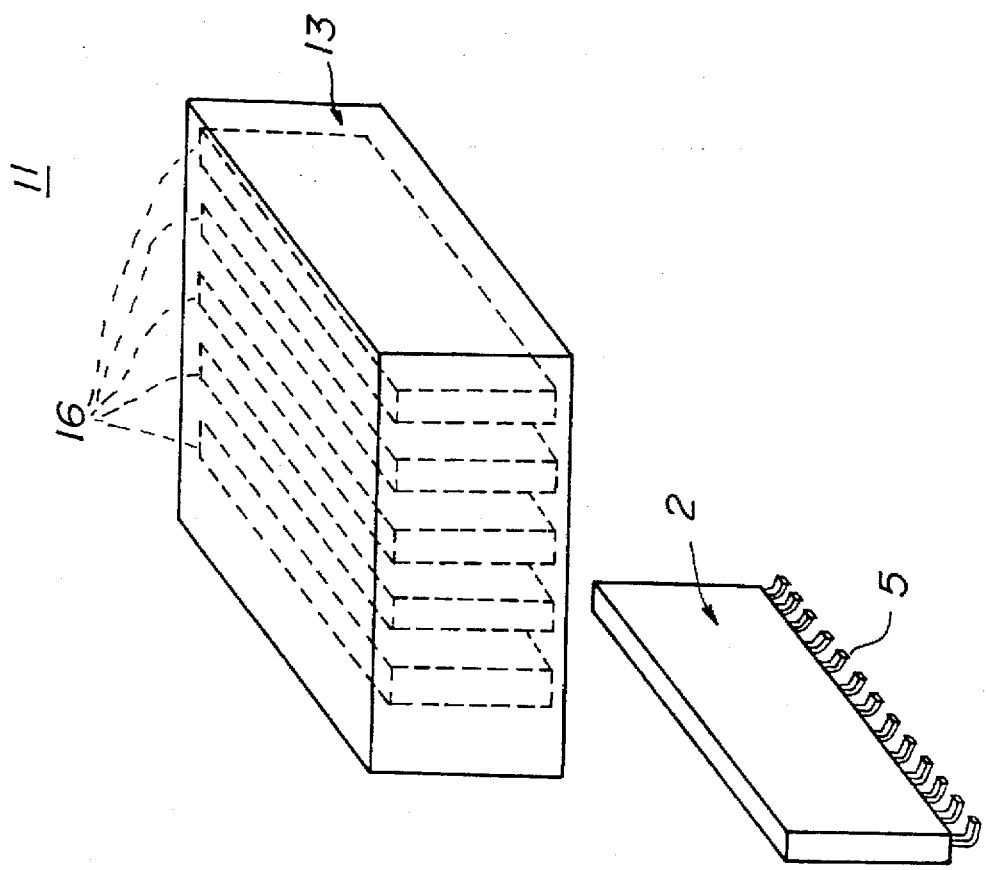
FIG. 5 is a perspective view showing a second embodiment of the semiconductor device unit according to the present invention.

FIG. 5 shows a second embodiment of the semiconductor device unit according to the present invention. A semiconductor device unit 11 shown in FIG. 5 includes a holder 13 and a plurality of semiconductor devices 2 held in holding parts 16 of the holder 13. In this embodiment, the holding part 16 opens only at the bottom surface of the holder 13. Hence, compared to the first embodiment shown in FIG. 1 in which a side surface 2a of each semiconductor device 2 held by the holder 3 is exposed to the outside, the mechanical strength and the heat resistance of the semiconductor device 2 is improved in this second embodiment.

In other words, the holding part 16 of the holder 13 is a rectangular well which opens only at the bottom surface of the holder 13. For this reason, the semiconductor device 2 is buried in the holder 13 when the semiconductor device 2 is held by the holding part 16, and all of the outer surfaces of the semiconductor device 2 excluding the surface provided with the leads 5 make contiguous contact with the walls defining the holding part 16. Therefore, the mechanical strength of the semiconductor device 2 is improved compared to that of the first embodiment, and it is also possible to improve the cooling efficiency of the semiconductor device 2.

Figure 6:
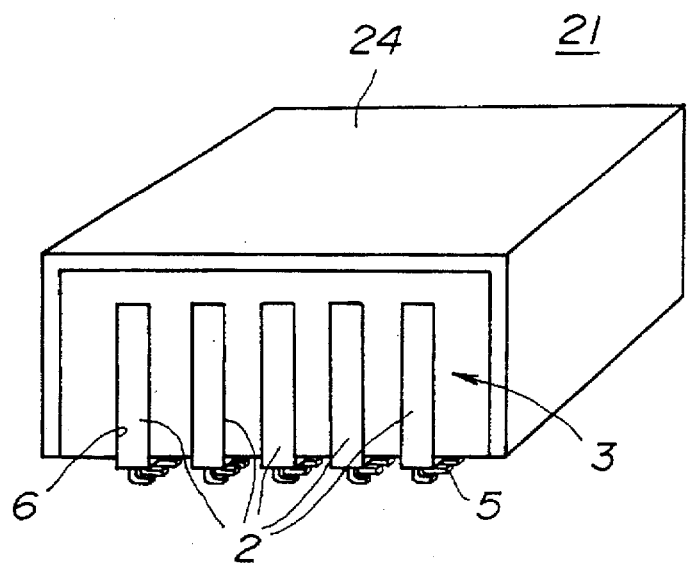
FIG. 6 is a perspective view showing a third embodiment of the semiconductor device unit according to the present invention.

FIG. 6 shows a third embodiment of the semiconductor device unit according to the present invention. In FIG. 6, those parts which are the same as those corresponding parts in FIGS. 1 through 3 are designated by the same reference numerals, and a description thereof will be omitted.

A semiconductor device unit 21 shown in FIG. 6 includes a cooling fin 24 which is provided around selected outer surfaces of the holder 3. For example, the cooling fin 24 is made of a metal, and improves the cooling efficiency of the semiconductor device 2.

Figure 7:
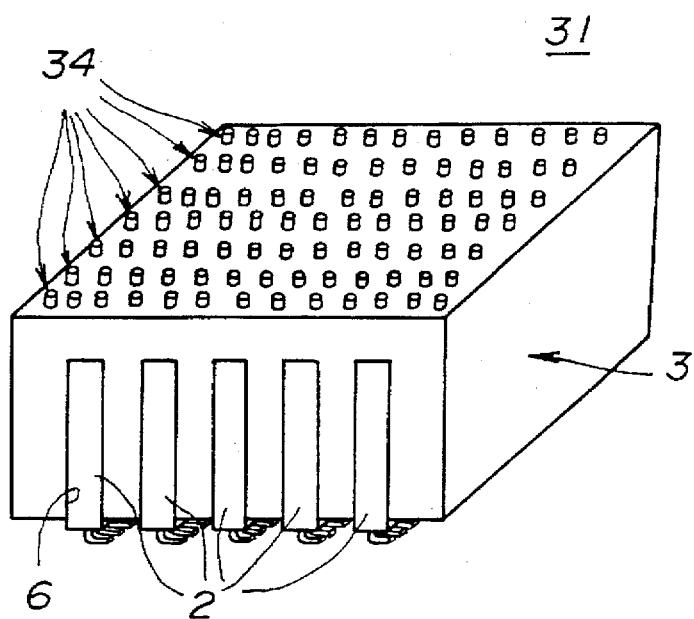
FIG. 7 is a perspective view showing a fourth embodiment of the semiconductor device unit according to the present invention.

FIG. 7 shows a fourth embodiment of the semiconductor device unit according to the present invention. In FIG. 7, those parts which are the same as those corresponding parts in FIGS. 1 through 3 are designated by the same reference numerals, and a description thereof will be omitted.

A semiconductor device unit 31 shown in FIG. 7 includes cooling fins 34 which are provided on the top surface of the holder 3. The cooling fins 34 improve the cooling efficiency of the semiconductor device 2.

In FIGS. 6 and 7, the holder 3 may be made of a metal or a plastic, and the cooling fins 24 and 34 may be made of a metal or a plastic. An arbitrary combination of materials may be used for the holder 3 and the cooling fins 24 and 34, but if the same material is used for the two, the cooling fins 24 and 34 may be integrally formed on the holder 3.

In the embodiments described above, the semiconductor device 2 has the L-shaped leads 5. However, it is possible to use other types of semiconductor devices such as the semiconductor devices shown in FIGS. 8 and 9. The semiconductor devices shown in FIGS. 8 and 9 may also be used in fifth through eighth embodiments which will be described later.

Figure 8:
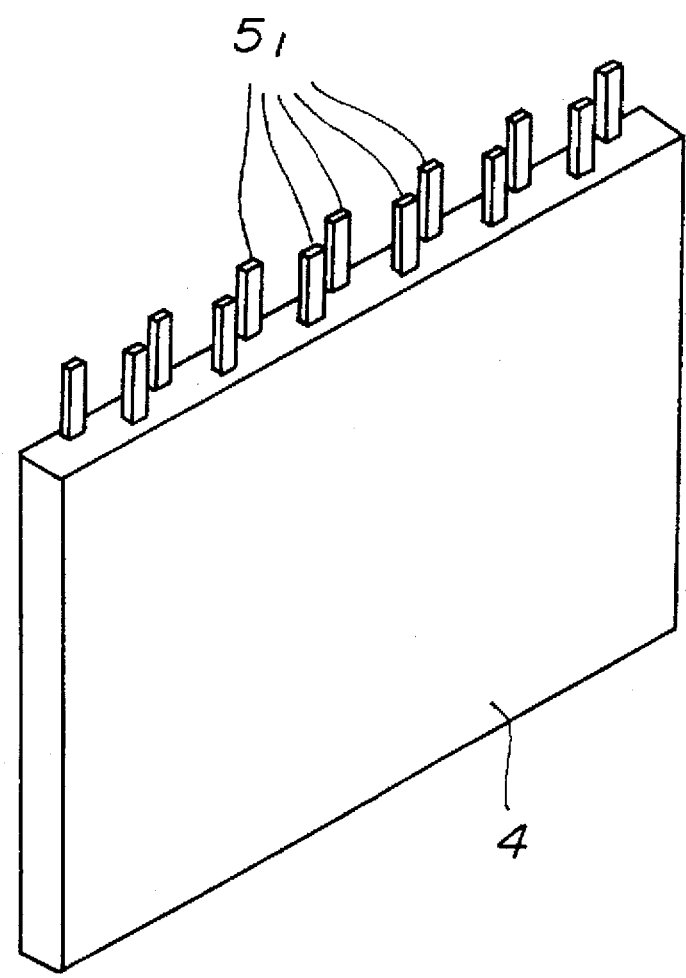
FIG. 8 is a perspective view showing a semiconductor device to which the present invention may be applied.

A semiconductor device $2_1$ shown in FIG. 8 has leads $5_1$ which are arranged in a zigzag manner, so that the density of the leads $5_1$ may be improved.

Figure 9:
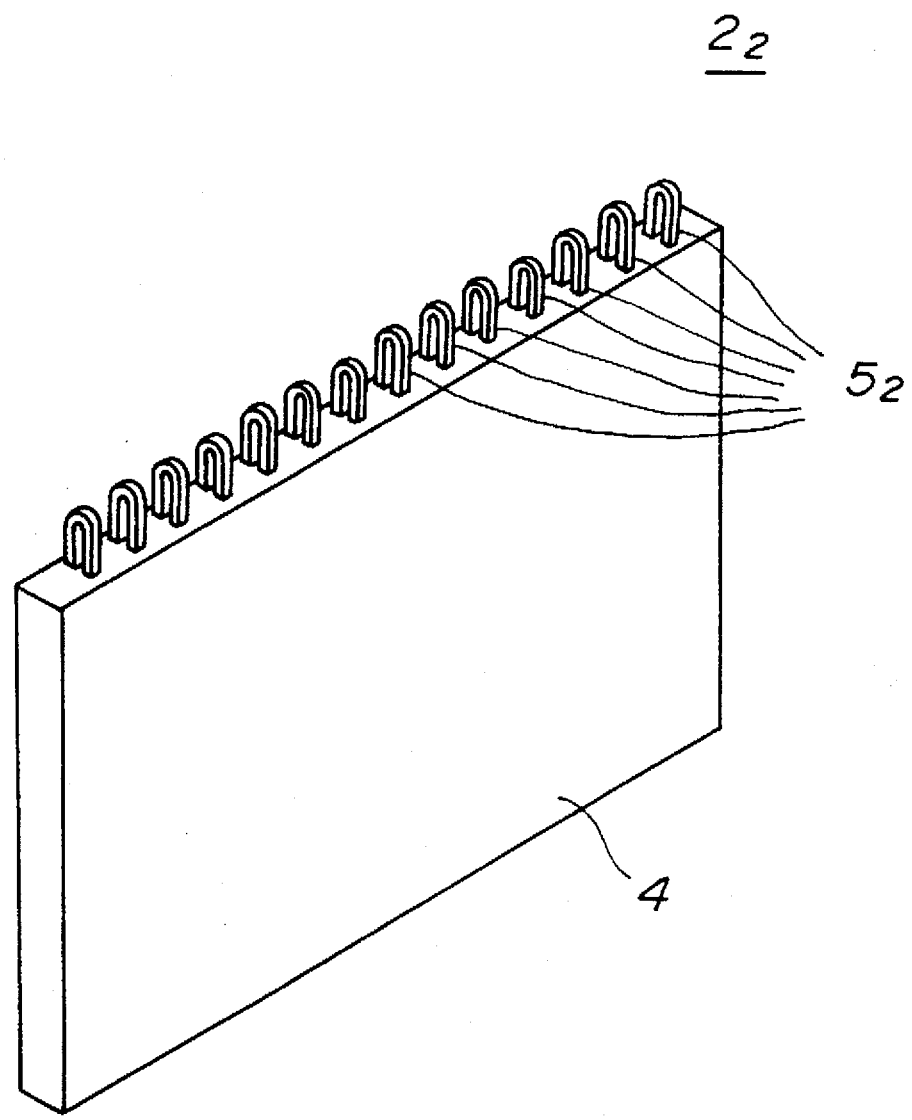
FIG. 9 is a perspective view showing another semiconductor device to which the present invention may be applied.

A semiconductor device $2_2$ shown in FIG. 9 has loop shaped leads $5_2$. The shape of the leads $5_2$ would make it almost impossible for the semiconductor device $2_2$ to stand by itself on the circuit substrate 7, but the present invention would enable a plurality of such semiconductor devices $2_2$ to stably stand on the circuit substrate 7 by the use of the holder.

Figure 10:
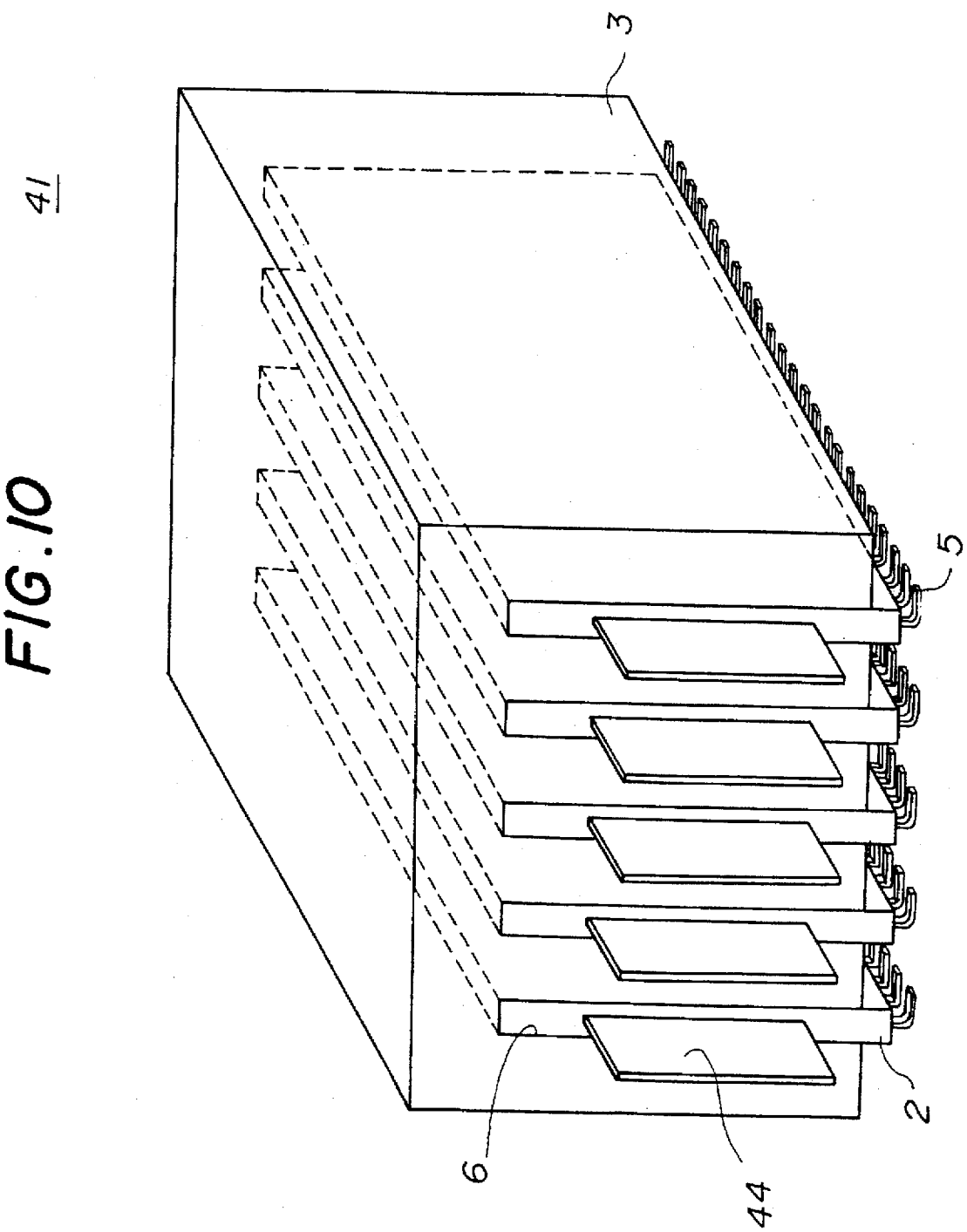
FIG. 10 is a perspective view showing a fifth embodiment of the semiconductor device unit according to the present invention.

FIG. 10 shows a fifth embodiment of the semiconductor device unit according to the present invention. In FIG. 10, those parts which are the same as those corresponding parts in FIGS. 1 through 3 are designated by the same reference numerals, and a description thereof will be omitted.

According to a semiconductor device unit 41 shown in FIG. 10, a cooling fin 44 is provided on the left part of each semiconductor device 2 which is held by the holder 3, and each cooling fin 44 projects from the holder 3. As a result, the cooling effect of the semiconductor device 2 is improved.

Figure 11:
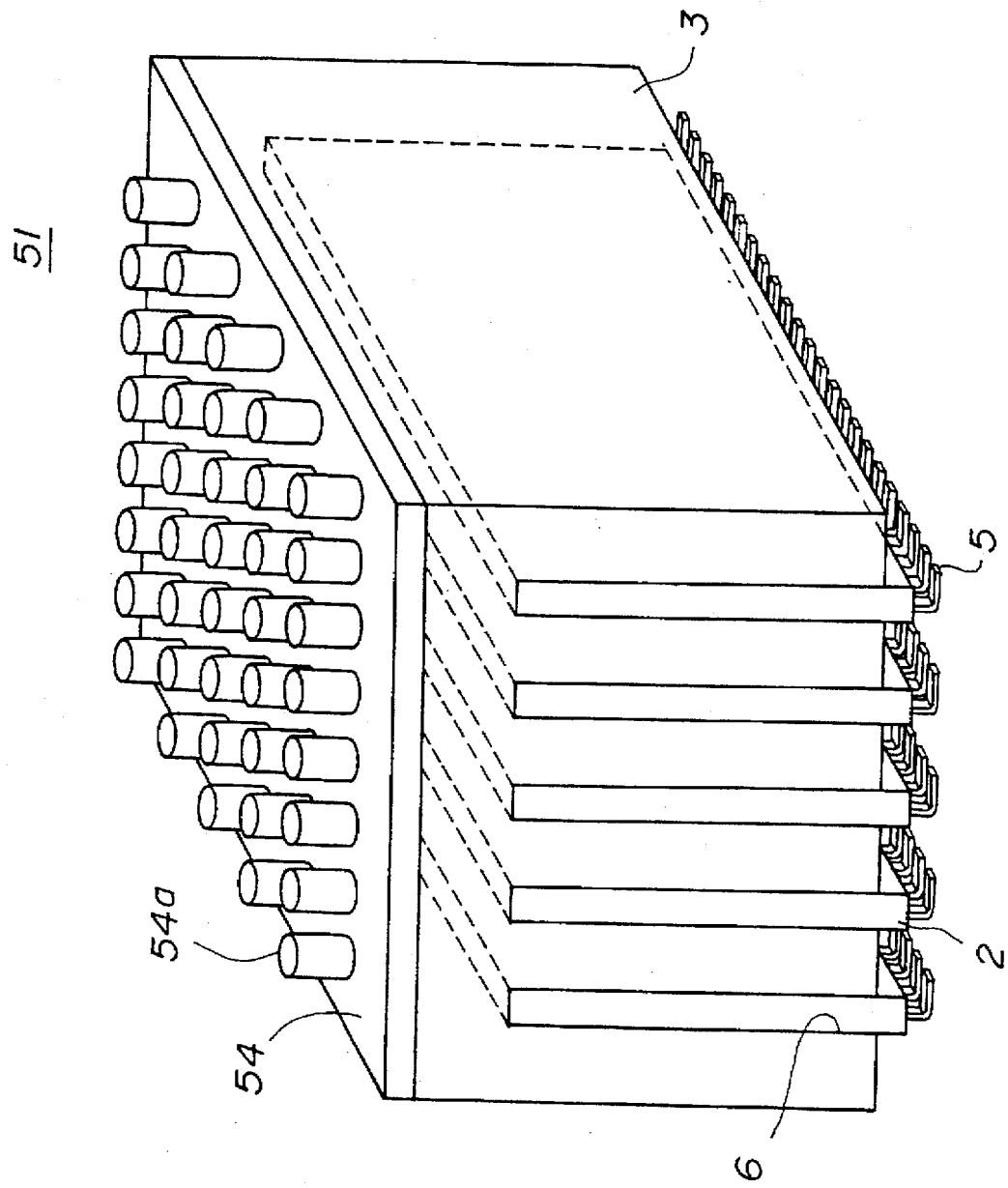
FIG. 11 is a perspective view showing a sixth embodiment of the semiconductor device unit according to the present invention.

FIG. 11 shows a sixth embodiment of the semiconductor device unit according to the present invention. In FIG. 11, those parts which are the same as those corresponding parts in FIGS. 1 through 3 are designated by the same reference numerals, and a description thereof will be omitted.

According to a semiconductor device unit 51 shown in FIG. 11, a cooling part 54 including a plurality of cooling pins 54a is provided on the top surface of the holder 3. The holder 3 may be made of a metal or a plastic, and the cooling part 54 may be made of a metal or a plastic. An arbitrary combination of materials may be used for the holder 3 and the cooling part 54, but if the same material is used for the two, the cooling part 54 may be integrally formed on the holder 3.

Figure 12:
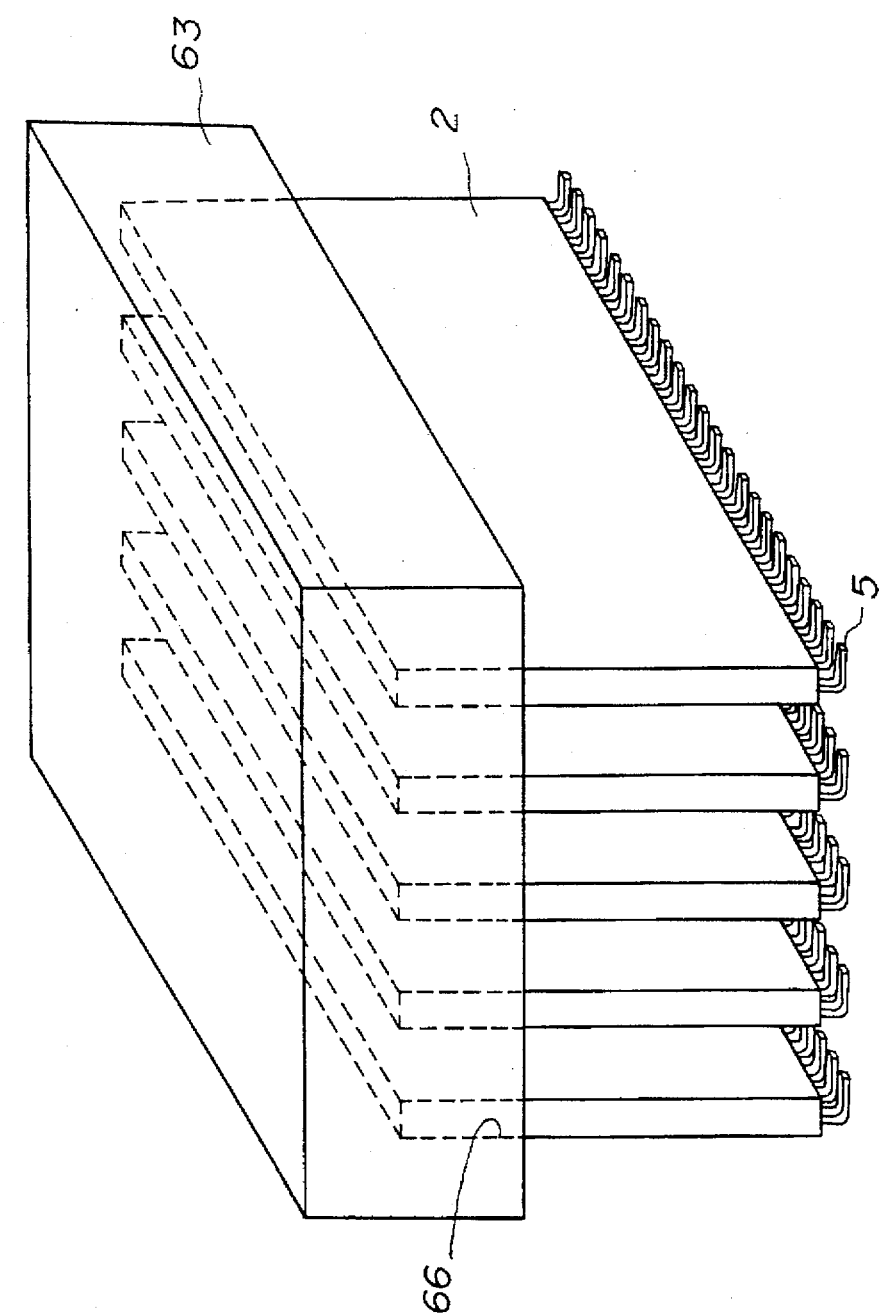
FIG. 12 is a perspective view showing a seventh embodiment of the semiconductor device unit according to the present invention.

FIG. 12 shows a seventh embodiment of the semiconductor device unit according to the present invention. In FIG. 12, those parts which are the same as those corresponding parts in FIGS. 1 through 3 are designated by the same reference numerals, and a description thereof will be omitted.

According to a semiconductor device unit 61 shown in FIG. 12, only the top part of each semiconductor device 2 is fit into a holder 63. In other words, a holding part 66 of the holder 63 holds only the top part of the semiconductor device 2. Walls of the holder 63 defining the holding part 66 make contiguous contact with the top part of the semiconductor device 2, and thus, the holder 63 can make the semiconductor devices 2 stand stably on the circuit substrate 7 when soldering the leads 5 onto the circuit substrate 7.

Figure 13:
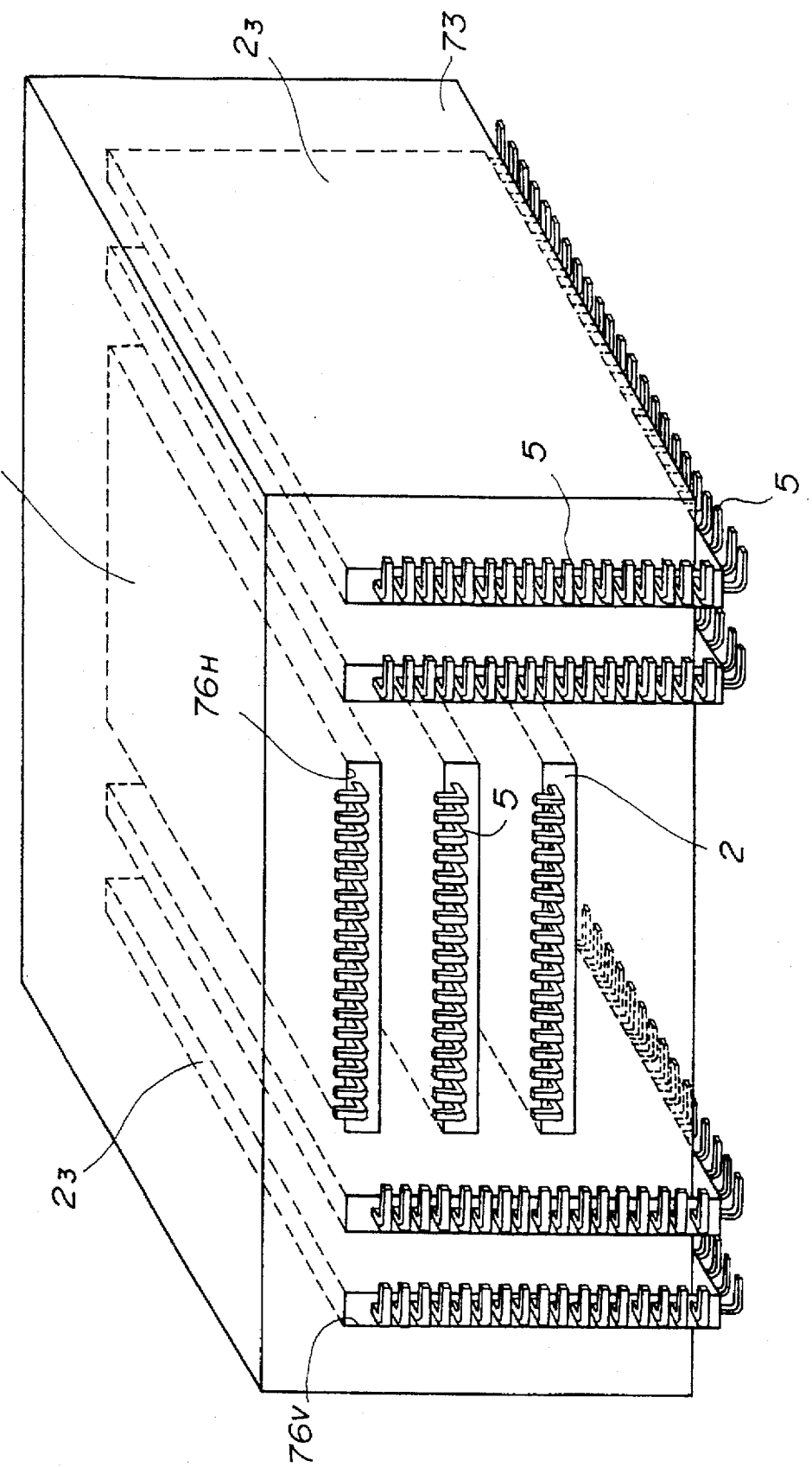
FIG. 13 is a perspective view showing an eighth embodiment of the semiconductor device unit according to the present invention.

FIG. 13 shows an eighth embodiment of the semiconductor device unit according to the present invention. In FIG. 13, those parts which are the same as those corresponding parts in FIGS. 1 through 3 are designated by the same reference numerals, and a description thereof will be omitted.

According to a semiconductor device unit 71 shown in FIG. 13, a holder 72 has holding parts $76_V$ for vertically holding semiconductor devices $2_3$, and holding parts $76_H$ for horizontally holding the semiconductor devices 2. Each semiconductor device $2_3$ has the leads 5 provided on two adjacent side surfaces thereof. When the semiconductor device $2_3$ is held by the holding part $76_V$ of the holder 73, the leads 5 of the semiconductor device $2_3$ are exposed at the front and bottom surfaces of the holder 73. On the other hand, when the semiconductor device 2 is held by the holding part $76_H$ of the holder 73, the leads of the semiconductor device 2 are exposed at the front surface of the holder 73. Therefore, according to this embodiment, both the leads 5 exposed at the front surface of the holder 73 and the leads 5 exposed at the bottom surface of the holder 73 can be soldered onto the circuit substrate 7. This embodiment is thus advantageous in that the semiconductor devices $2_3$ having a large number of leads 5 can be packaged on the circuit substrates 7. In addition, different kinds of semiconductor devices can be positively supported by the holder 73 when making the packaging process.

Figure 14:
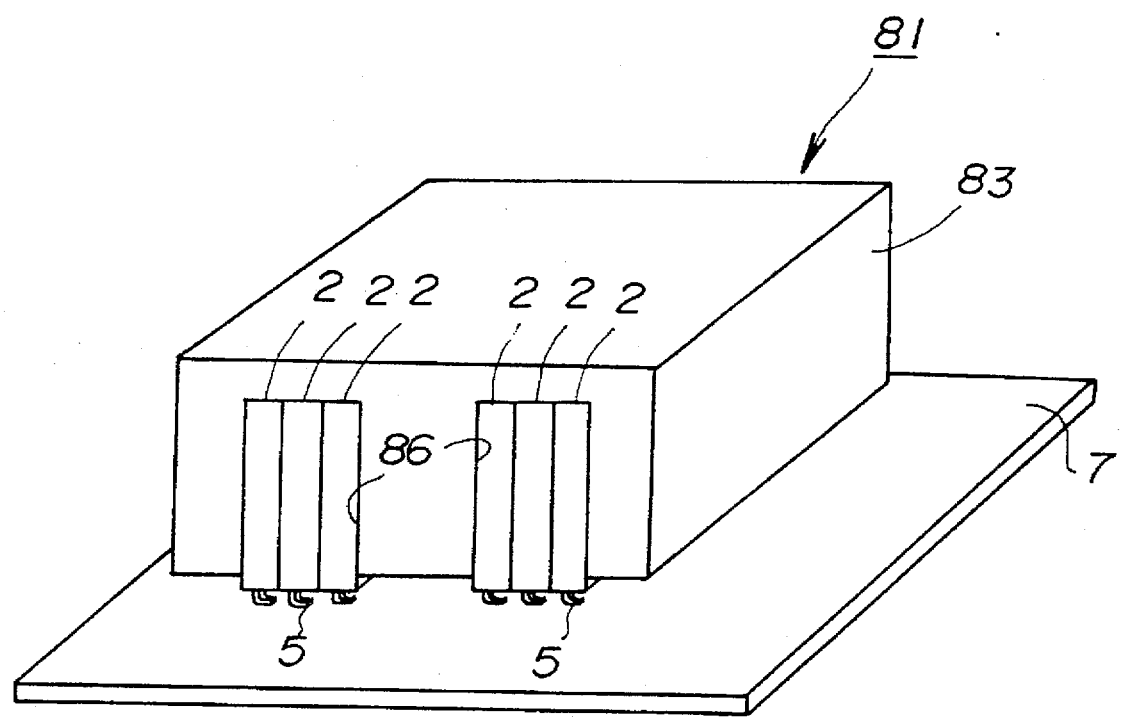
FIG. 14 is a perspective view showing a ninth embodiment of the semiconductor device unit according to the present invention.

FIG. 14 shows a ninth embodiment of the semiconductor device unit according to the present invention. In FIG. 14, those parts which are the same as those corresponding parts in FIGS. 1 through 3 are designated by the same reference numerals, and a description thereof will be omitted.

According to a semiconductor device unit 81 shown in FIG. 14, a holder 83 has two holding parts 86. Each holding part 86 holds three semiconductor devices 2 in contiguous contact therewith. As a result, the pitch with which the semiconductor devices 2 may be arranged on the circuit substrate 7 may further be improved. Of course, the number of semiconductor devices 2 held by each holding part 86 of the holder 83 is not limited to three, and an arbitrary number of semiconductor devices 2 greater than one may be held by each holding part 86.

In each of the embodiments described above, it is desirable that no air exists between the surfaces of the semiconductor device and the walls of the holder holding at least a part of the semiconductor device. In order to ensure contiguous contact between the contacting surfaces of the semiconductor device and the walls defining the holding part of the holder, it is possible to coat a lubricant such as grease on the surface of the semiconductor device and/or the walls defining the holding part of the holder.

In addition, the shape of the holder is not limited to that of the described embodiments. In other words, the holder in the described embodiments has a generally parallelepiped shape in conformance with the generally parallelepiped shape of the semiconductor device, but it is of course possible to employ other shapes for the holder.

Moreover, in each of the embodiments excluding the second embodiment, the side surface of the semiconductor device exposed at the front of the holder does not necessarily have to coincide with the front surface of the holder. In other words, the end part of the semiconductor device may project slightly from the front surface of the holder.

Further, the present invention is not limited to these embodiments, but various variations and modifications may be made without departing from the scope of the present invention.

What is claimed is:

1. A semiconductor device unit supporting semiconductor devices on a horizontally extending substrate comprising:

a holder formed of a resin, having a plurality of internal holding parts extending in a first direction and a bottom, each of the holding parts having a slot structure opening toward the bottom of the holder; and a plurality of semiconductor devices in the form of resin encapsulated packages extending in the first direction, with leads, the semiconductor devices being releasably retained by the holding parts of said holder for release from the holder through openings in the slot structures, the leads of the semiconductor devices being exposed outside of the holder such that the holder and the semiconductor devices retained therein are releasably supported upon the horizontally extending substrate by only the exposed leads of the semiconductor devices, each of said semiconductor devices having a generally parallelepiped shape with parallel front and back side surfaces and a bottom surface provided with the leads which are exposed outside of the holder, the front and back side surfaces extending in the first direction and the bottom surface extending in a second direction which is generally perpendicular to the first direction, said leads extending laterally from the bottom surface, for each of the plurality of semiconductor devices, the entire bottom surface is substantially smaller than the entire front side surface and substantially smaller than the entire back side surface.

2. The semiconductor device unit as claimed in claim 1, wherein the slot structures each have inner walls, each said semiconductor device being held between the inner walls of the slot structure.

3. The semiconductor device unit as claimed in claim 1, wherein the holding parts of said holder hold said semiconductor devices in a vertical arrangement and parallel to each other.

4. The semiconductor device unit as claimed in claim 1, wherein at least the bottom surface of each semiconductor device is exposed through the opening in the slot structure.

5. The semiconductor device unit as claimed in claim 1, wherein the holding parts of said holder have a well structure such that only the bottom surface of each semiconductor device is exposed.

6. The semiconductor device unit as claimed in claim 1, wherein only an end part of each semiconductor device excluding the end provided with the leads is held by said holder.

7. The semiconductor device unit as claimed in claim 1, wherein the bottom surface and a lateral side surface of each semiconductor device are exposed, the lateral side surface being perpendicular to and connecting the front and back side surfaces.

8. The semiconductor device unit as claimed in claim 7, wherein an end part of the semiconductor device including the bottom surface of the semiconductor device projects from said holder.

9. The semiconductor device unit as claimed in claim 1, which further comprises a cooling part provided on said holder for radiating heat generated from each semiconductor device.

10. The semiconductor device unit as claimed in claim 9, wherein said cooling part covers at least one predetermined outer surface of said holder.

11. The semiconductor device unit as claimed in claim 9, wherein said holder is made of a material selected from a group consisting of metals and plastics, and said cooling part is made of a material selected from a group consisting of metals and plastics.

12. The semiconductor device unit as claimed in claim 11, wherein said holder and said cooling part are integrally formed from the same material.

13. The semiconductor device unit as claimed in claim 1, wherein each holding part of said holder holds a plurality of semiconductor devices.

14. The semiconductor device unit as claimed in claim 1, wherein the holding parts of said holder include first holding parts vertically holding some of the semiconductor devices and second holder parts horizontally holding some of the semiconductor devices.

15. The semiconductor device unit as claimed in claim 1, wherein walls of said holder defining the holding part make contiguous contact with at least the front and back side surfaces of the semiconductor device which is held thereby.

16. The semiconductor device unit as claimed in claim 15, wherein a lubricant is coated on at least one of the walls of said holder defining the holding part and at least the front and back side surfaces of the semiconductor device which is held thereby.

17. The semiconductor device unit as claimed in claim 1, wherein the leads of the semiconductor device have a shape selected from a group consisting of an L-shape and a loop shape.

18. The semiconductor device unit as claimed in claim 1, wherein the leads of the semiconductor device are arranged in a zigzag pattern on the bottom surface thereof.

19. The semiconductor device unit as claimed in claim 1, wherein each of said semiconductor devices has a configuration such that the semiconductor device cannot stably stand vertically by itself on its exposed leads.

20. The semiconductor device unit as claimed in claim 1, wherein each holding part of said holder holds one semiconductor device.

21. A semiconductor device unit supporting semiconductor devices on a horizontally extending substrate comprising:

a holder formed of a resin having a plurality of internal holding parts extending in a first direction; and a plurality of semiconductor devices in the form of resin encapsulated packages extending in the first direction, with leads, the semiconductor devices being releasably retained by the holding parts of said holder with the leads exposed outside of the holder such that the holder and the semiconductor devices retained therein are releasably supported upon the horizontally extending substrate by only the exposed leads of the semiconductor devices, each of said semiconductor devices having a generally parallelepiped shape with parallel front and back side surfaces and a bottom surface provided with the leads which are exposed outside of the holder, the front and back side surfaces extending in the first direction and the bottom surface extending in a second direction which is generally perpendicular to the first direction, said leads extending laterally from the bottom surface, wherein the holding parts of said holder have a slot structure such that a lateral side surface and the bottom surface of each semiconductor device are exposed, the lateral side surface being perpendicular to and connecting the front and back side surfaces, wherein each semiconductor device has a cooling fin which extends outwardly from the lateral side surface of the semiconductor device, and the cooling fin is exposed via the holding part which has the slot structure.

22. A semiconductor device unit supporting semiconductor devices on a horizontally extending substrate comprising:

a holder formed of a resink having a plurality of internal holding parts extending in a first direction and a bottom, each of the holding parts having a slot structure opening toward the bottom of the holder;

a plurality of semiconductor devices in the form of resin encapsulated packages extending in the first direction, with leads, the semiconductor devices being releasably retained by the holding parts of said holder for release from the holder through openings in the slot structures, the leads of the semiconductor devices being exposed outside of the holder such that the holder and the semiconductor devices retained therein are releasably supported upon the horizontally extending substrate by only the exposed leads of the semiconductor devices, each of said semiconductor devices having a generally parallelepiped shape with parallel front and back side surfaces and a bottom surface provided with the leads which are exposed outside of the holder, the front and back side surfaces extending in the first direction and the bottom surface extending in a second direction which is generally perpendicular to the first direction, said leads extending laterally from the bottom surface, for each of the plurality of semiconductor devices, the entire bottom surface is substantially smaller than the entire front side surface and substantially smaller than the entire back side surface a cooling part provided on said holder for radiating heat generated from each semiconductor device, wherein said cooling part comprises a plurality of pins which project from at least one predetermined outer surface of said holder.

23. A semiconductor device unit supporting semiconductor devices on a horizontally extending substrate comprising:

a holder formed of a resin having a plurality of internal holding parts extending in a first direction; and a plurality of semiconductor devices in the form of resin encapsulated packages extending in the first direction, with leads, the semiconductor devices being releasably retained by the holding parts of said holder with the leads exposed outside of the holder such that the holder and the semiconductor devices retained therein are releasably supported upon the horizontally extending substrate by only the exposed leads of the semiconductor devices, each of said semiconductor devices having a generally parallelepiped shape with parallel front and back side surfaces and a bottom surface provided with the leads which are exposed outside of the holder, the front and back side surfaces extending in the first direction and the bottom surface extending in a second direction which is generally perpendicular to the first direction, said leads extending laterally from the bottom surface, wherein the holding parts of said holder include first holding parts vertically holding some of the semiconductor devices and second holding parts horizontally holding some of the semiconductor devices, wherein the semiconductor devices held by the first holding part of said holder have leads provided on the bottom surface and a lateral side surface thereof, the lateral side surface being perpendicular to and connecting the front and back side surfaces.

* * * * *

UNITED STATES PATENT AND TRADEMARK OFFICE
CERTIFICATE OF CORRECTION

PATENT NO. : 5,684,675
DATED : Nov. 4, 1997
INVENTOR(S) : TANIGUCHI et al.

It is certified that error appears in the above-identified patent and that said Letters Patent is hereby corrected as shown below:

Col. 9, line 44 (Claim 22, line 4), change "resink" to --resin,--.

Col. 10, line 15 (Claim 22, line 29), after "back side surface" insert --, and--.

Signed and Sealed this

Tenth Day of March, 1998

Attest:

BRUCE LEHMAN

Attesting Officer

Commissioner of Patents and Trademarks